(12) United States Patent
Asahi et al.

(10) Patent No.: US 11,252,814 B2
(45) Date of Patent: Feb. 15, 2022

(54) GROUNDING STRUCTURE OF HIGH FREQUENCY CIRCUIT BOARD

(71) Applicants: KABUSHIKI KAISHA TOSHIBA, Minato-ku (JP); TOSHIBA INFRASTRUCTURE SYSTEMS & SOLUTIONS CORPORATION, Kawasaki (JP)

(72) Inventors: Yasuaki Asahi, Kawasaki (JP); Haruo Kojima, Kawasaki (JP)

(73) Assignees: KABUSHIKI KAISHA TOSHIBA, Minato-ku (JP); TOSHIBA INFRASTRUCTURE SYSTEMS & SOLUTIONS CORPORATION, Kawasaki (JP)

( * ) Notice: Subject to any disclaimer, the term of this patent is extended or adjusted under 35 U.S.C. 154(b) by 134 days.

(21) Appl. No.: 16/645,956

(22) PCT Filed: May 27, 2019

(86) PCT No.: PCT/JP2019/020861
§ 371 (c)(1),
(2) Date: Mar. 10, 2020

(87) PCT Pub. No.: WO2020/070919
PCT Pub. Date: Apr. 9, 2020

(65) Prior Publication Data
US 2020/0344874 A1    Oct. 29, 2020

(30) Foreign Application Priority Data
Oct. 5, 2018    (JP) .............................. JP2018-190092

(51) Int. Cl.
*H05K 1/02*    (2006.01)
*H01L 23/498*    (2006.01)
(Continued)

(52) U.S. Cl.
CPC ..... *H05K 1/0237* (2013.01); *H01L 23/49838* (2013.01); *H01L 23/66* (2013.01);
(Continued)

(58) Field of Classification Search
CPC ........................... H05K 1/0237; H05K 1/115; H01L 23/49838; H01L 23/66; H01L 2223/6683; H01P 3/081
(Continued)

(56) References Cited

U.S. PATENT DOCUMENTS

2014/0001150 A1*    1/2014    Lecesse ................. H05K 3/429
216/18
2016/0195432 A1*    7/2016    Joo ........................ H05K 1/115
250/214 A

FOREIGN PATENT DOCUMENTS

CN    110140430 A    *    8/2019    ............. H05K 1/115
JP    56-85415 U    7/1981
(Continued)

OTHER PUBLICATIONS

International Search Report dated Jul. 9, 2019 in PCT/JP2019/020861 filed on May 27, 2019.
(Continued)

*Primary Examiner* — Robert J Pascal
*Assistant Examiner* — Kimberly E Glenn
(74) *Attorney, Agent, or Firm* — Oblon, McClelland, Maier & Neustadt, L.L.P.

(57) ABSTRACT

A grounding structure of the high-frequency circuit board includes a dielectric substrate, a back surface ground electrode, an upper ground electrode, and a microstripline upper electrode. The dielectric substrate has a first surface and a second surface, and is provided with a first through-hole. A first opening of the first through-hole at the first surface is smaller than a second opening of the first through-hole at the
(Continued)

second surface. A first grounding conductor layer is provided in the first through-hole. The back surface ground electrode is provided at the second surface and is connected with the first grounding conductor layer. The upper ground electrode is provided at the first surface and is connected with the first ground conductor layer. The microstripline upper electrode is provided at the first surface.

6 Claims, 11 Drawing Sheets

(51) Int. Cl.
  *H01L 23/66* (2006.01)
  *H01P 3/08* (2006.01)
  *H05K 1/11* (2006.01)

(52) U.S. Cl.
  CPC .............. *H01P 3/081* (2013.01); *H05K 1/115* (2013.01); *H01L 2223/6683* (2013.01)

(58) Field of Classification Search
  USPC .......................................................... 333/238
  See application file for complete search history.

(56) References Cited

FOREIGN PATENT DOCUMENTS

| | | |
|---|---|---|
| JP | 59-112701 A | 6/1984 |
| JP | 61-59764 A | 3/1986 |
| JP | 2-36202 U | 3/1990 |
| JP | 3-131102 A | 6/1991 |
| JP | 5-327323 A | 12/1993 |
| JP | 11-3904 A | 1/1999 |
| WO | WO-2019124670 A1 * | 6/2019 ............... H05K 3/42 |

OTHER PUBLICATIONS

International Preliminary Report on Patentability dated Apr. 15, 2021 in PCT/JP2019/020861 filed, (submitting English translation only) 6 pages.

* cited by examiner

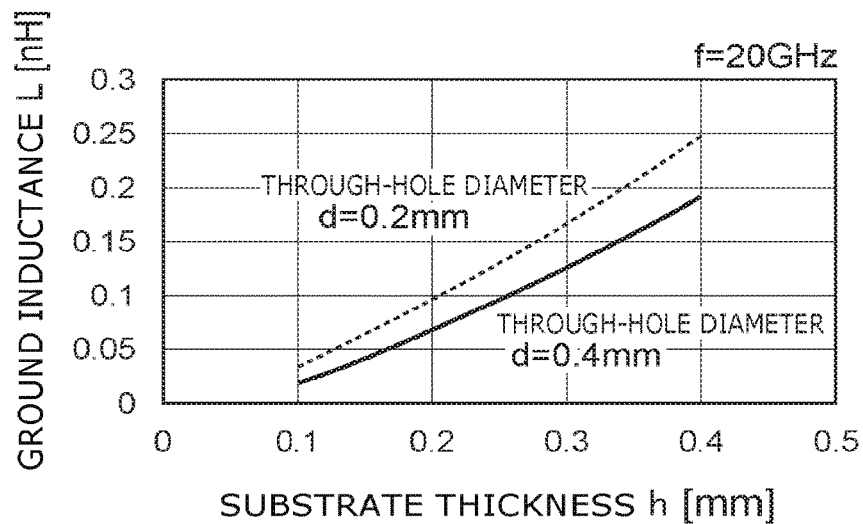 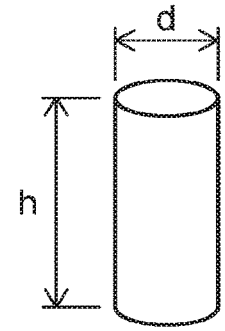
FIG. 5A  FIG. 5B
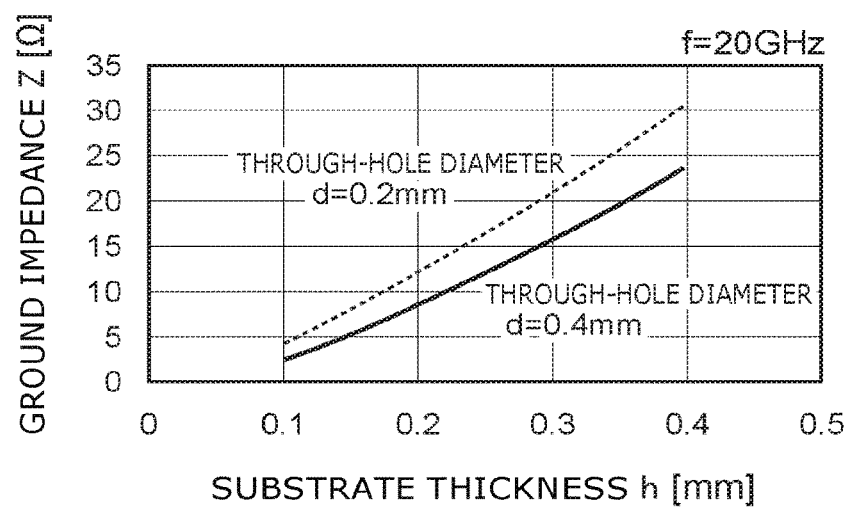
FIG. 6

GROUNDING STRUCTURE OF HIGH FREQUENCY CIRCUIT BOARD

TECHNICAL FIELD

Embodiments of the invention relates to a grounding structure of high frequency circuit board.

BACKGROUND ART

A MMIC (Monolithic Microwave Integrated Circuit) chip often is contained in a surface-mount package such as a QFN (Quad Flat Non-leaded Package).

This package can be surface-mounted to a high frequency circuit board by using reflow soldering. In such a case, it is desirable to increase the dielectric thickness to reduce the warp of the high frequency circuit board.

However, at high frequencies of several GHz or more, the high frequency characteristics degrade due to an increase of the ground inductance if the grounding is performed via a through-hole provided in a thick dielectric substrate.

CITATION LIST

Patent Literature

[Patent Literature 1] JP S59-112701 B2

SUMMARY OF INVENTION

Problem to be Solved by the Invention

To provide a grounding structure of a high frequency circuit board in which the ground inductance is reduced and the high frequency characteristics at several GHz or more are improved.

Means for Solving the Problem

A grounding structure of a high frequency circuit board of an embodiment includes a dielectric substrate, a back surface ground electrode, an upper ground electrode, and a microstripline upper electrode. The dielectric substrate has a first surface, a second surface provided at a side opposite to the first surface, and a first through-hole provided in the dielectric substrate. A first opening of the first through-hole at the first surface is smaller than a second opening of the first through-hole at the second surface. The first grounding conductor layer is provided in the first through-hole. The back surface ground electrode is provided at the second surface and connected with the first grounding conductor layer. The upper ground electrode is provided at the first surface and connected with at least the first grounding conductor layer. The microstripline upper electrode is provided at the first surface. The microstripline upper electrode includes at least a first region having a first line width; the microstripline upper electrode has one end portion provided to oppose the first opening and overlap the second opening; and a second line width of the one end portion is narrower than the first line width.

BRIEF DESCRIPTION OF DRAWINGS

FIG. 5A is a graph illustrating the ground inductance of the through-hole with respect to the thickness of the dielectric substrate; and FIG. 5B is a schematic perspective view of an example of the through-hole.

FIG. 6 is a graph illustrating the ground impedance of the through-hole with respect to the dielectric substrate thickness.

DESCRIPTION OF EMBODIMENTS

Embodiments of the invention will now be described with reference to the drawings.

Figure 1A:
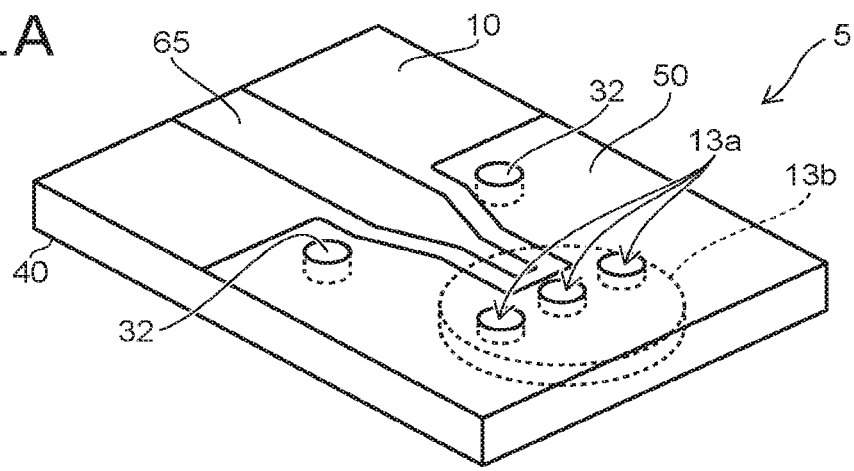
FIG. 1A is a schematic perspective view of a grounding structure of a high frequency circuit board according to a first embodiment.
Figure 1B:
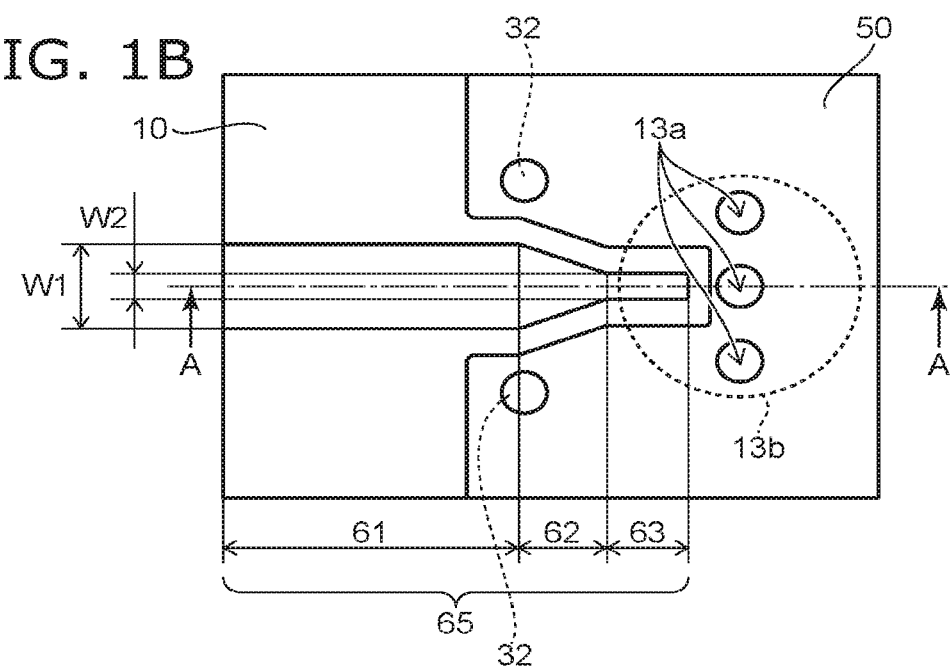
FIG. 1B is a schematic top view of the grounding structure.

FIG. 1A is a schematic perspective view of a grounding structure of a high frequency circuit board according to a first embodiment; FIG. 1B is a schematic top view of the grounding structure; and FIG. 1C is a schematic cross-sectional view along line A-A.

The grounding structure of the high frequency circuit board 5 includes a dielectric substrate 10, a first grounding conductor layer 30, a back surface ground electrode 40, an upper ground electrode 50, and a microstripline upper electrode 65.

Figure 1C:
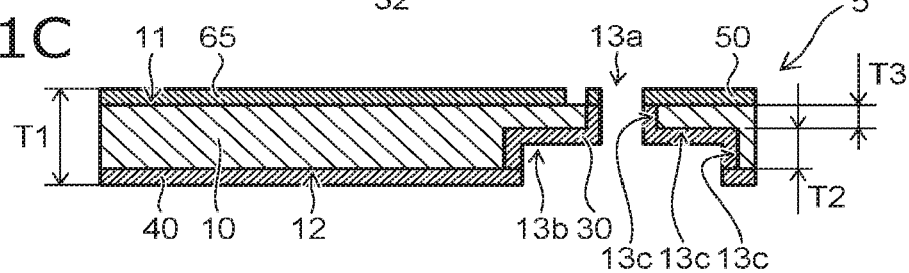
FIG. 1C is a schematic cross-sectional view along line A-A.

As illustrated in FIG. 1C, the dielectric substrate 10 has a first surface 11, and a second surface 12 provided at a side opposite to the first surface 11. A first through-hole 13 is provided in the dielectric substrate 10. A first opening 13a of the first through-hole 13 at the first surface 11 is smaller than a second opening 13b of the first through-hole 13 at the second surface 12.

It is unfavorable to reduce a thickness T1 of the dielectric substrate 10 because although the ground inductance of the through-hole is suppressed and the high frequency characteristics improve, on the other hand, the mechanical strength decreases due to an increase of the warp of the high frequency circuit board 5, etc. Therefore, for example, the thickness T1 of the dielectric substrate 10 is set to 0.4 mm, etc.

The dielectric substrate 10 of the first embodiment has a cross section such as that of FIG. 1C. First, the dielectric substrate 10 is machined from the second surface 12 side. The diameter of the second opening 13b is set to 1.7 mm, etc.; and the diameter of the first opening 13a is set to 0.4 mm, etc. A depth T2 of the second opening 13b from the second surface 12 is set to 0.3 mm, etc. Also, a depth T3 of the first opening 13a from the first surface 11 is set to 0.1 mm, etc.

Then, the machined surface is metalized. In the drawing, the first opening 13a includes three regions. The first grounding conductor layer 30 is provided at a sidewall 13c of the first through-hole 13.

The back surface ground electrode 40 is provided at the second surface 12 and connected with the first grounding conductor layer 30.

The upper ground electrode 50 is provided at the first surface 11 and connected with the first grounding conductor layer 30.

The microstripline upper electrode 65 is provided at the first surface 11. The microstripline upper electrode 65 includes at least a first region 61. In the drawing, a second region 63 is further provided. One end portion of the microstripline upper electrode 65 (in the drawing, the end portion of the second region) is provided to oppose the first opening 13a and overlap the second opening 13b when viewed in plan. A line width W2 of the one end portion is narrower than a line width W1 of the first region 61. The microstripline upper electrode 65 may include a third region 62 which is provided between the first region 61 and the second region 63, and of which the line width changes continuously.

Figure 2A:
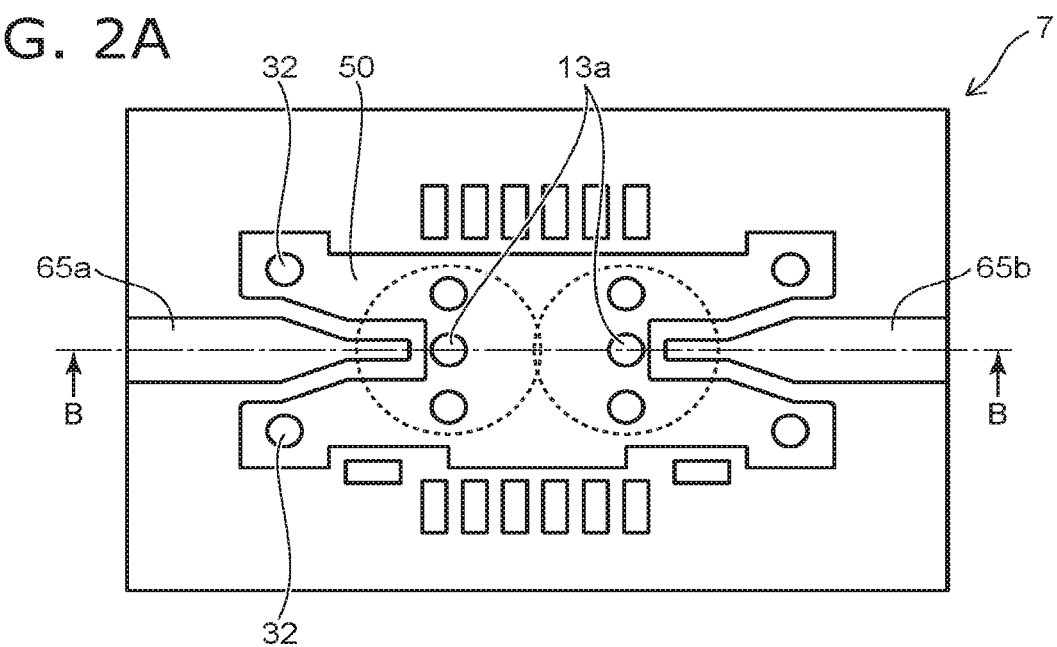
FIG. 2A is a schematic plan view of the high frequency circuit board to which a QFN (Quad Flat Non-leaded Package) including a MMIC is mounted using the grounding structure according to the first embodiment.
Figure 2B:
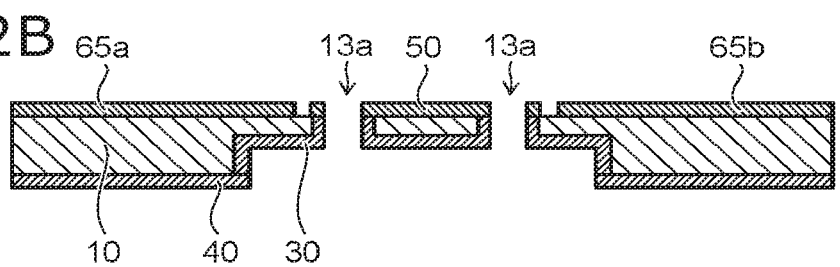
FIG. 2B is a schematic cross-sectional view along line B-B.

FIG. 2A is a schematic plan view of the high frequency circuit board to which a QFN (Quad Flat Non-leaded Package) including a MMIC is mounted using the grounding structure according to the first embodiment; and FIG. 2B is a schematic cross-sectional view along line B-B.

A microstripline upper electrode 65a for inputting a signal to the QFN is provided; and a microstripline upper electrode 65b for outputting a signal from the QFN is provided. Also, the two grounding structures are provided respectively at the input terminal side and the output terminal side of the QFN.

Figure 3A:
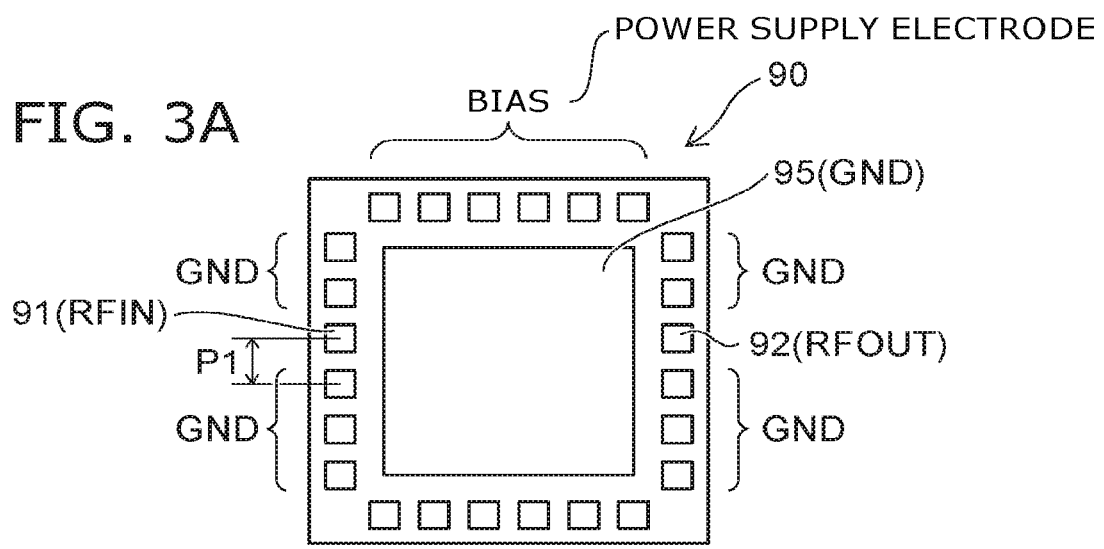
FIG. 3A is a schematic bottom view of the QFN.
Figure 3B:
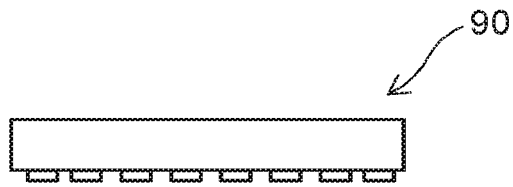
FIG. 3B is a schematic side view.
Figure 3C:
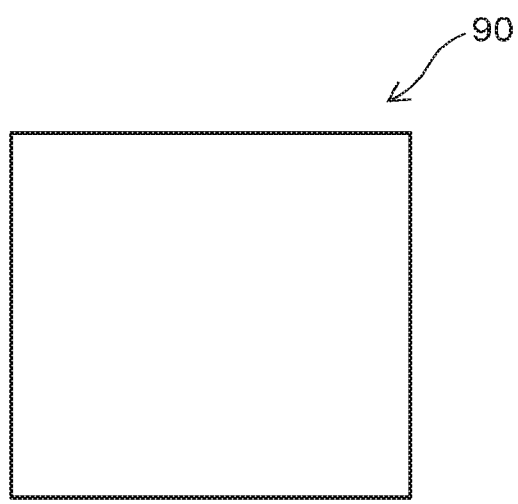
FIG. 3C is a schematic top view.

FIG. 3A is a schematic bottom view of the QFN; FIG. 3B is a schematic side view; and FIG. 3C is a schematic top view.

A ground electrode 95 provided at the central portion, as well as an RF signal input (RFIN) electrode 91, an RF signal output (RFOUT) electrode 92, bias power supply electrodes including a power supply voltage, and ground electrodes (GND) provided to surround the ground electrode 95, etc., are provided at the lower surface of the QFN as illustrated in FIG. 3A. A pitch P1 between the RF signal input electrode 91 and the ground electrodes (GND) at two sides of the RF signal input electrode 91 is set to 0.5 mm, etc. In the QFN as illustrated in FIG. 3C, an electrode pattern or the like may not be provided at the upper surface.

Figure 4A:
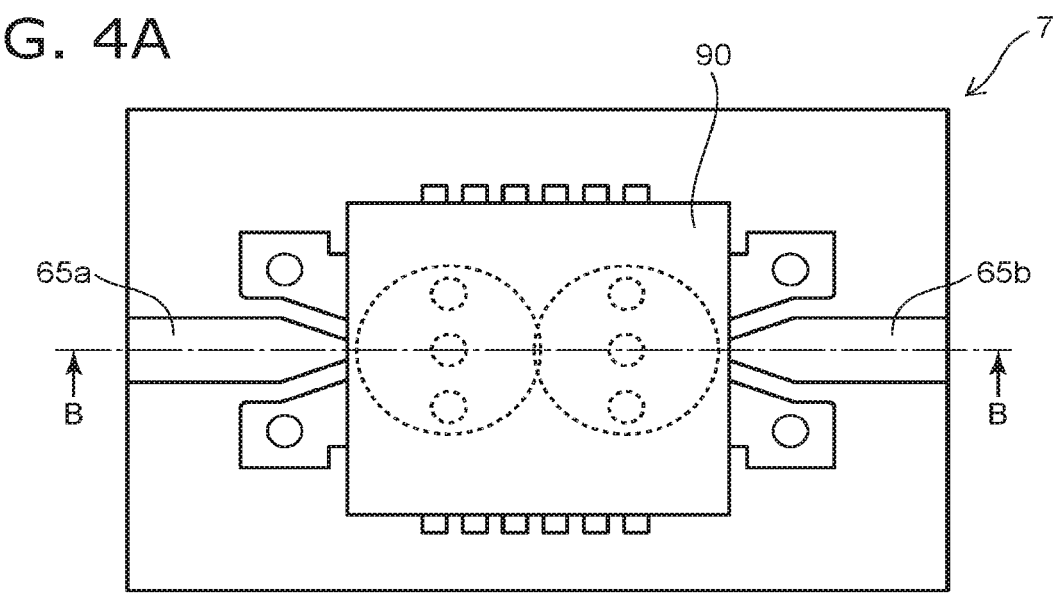
FIG. 4A is a schematic plan view of the QFN surface-mounted to the high frequency circuit board according to the first embodiment.
Figure 4B:
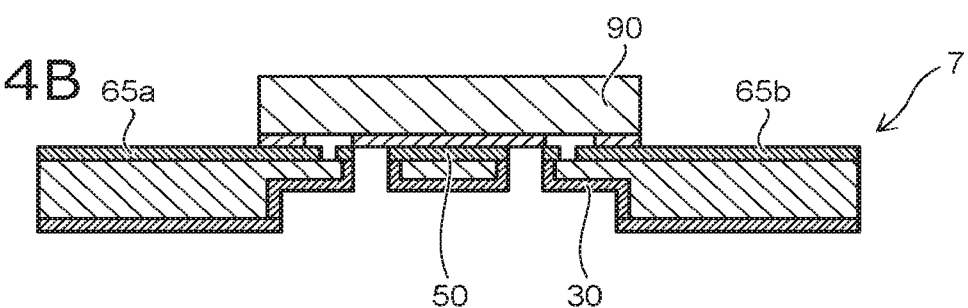
FIG. 4B is a schematic cross-sectional view along line B-B.

FIG. 4A is a schematic plan view of the QFN surface-mounted to the high frequency circuit board according to the first embodiment; and FIG. 4B is a schematic cross-sectional view along line B-B.

A high frequency device 90 is surface-mounted to the high frequency circuit board 7 by a reflow soldering process, etc. The ground electrode 95 which is provided at the center is connected to the upper ground electrode 50 of the high frequency circuit board 7. For example, the high frequency device 90 can be an amplifier, an RF switch, a phase shifter, an attenuator, etc. Applications of the high frequency device 90 include millimeter-wave wireless devices, small satellite communication stations, etc.

In the first embodiment, the line width W1 of the first region 61 can be set to 0.8 mm; and a width W2 of the second region 63 can be set to 0.25 mm, etc. Therefore, the signal terminal and the ground electrodes next to the signal terminal are not shorted by the microstripline upper electrode 65.

For the first embodiment, the reduction of the ground inductance of the first grounding conductor layer 30 provided at the sidewall of the first through-hole 13 and the improvement of the high frequency characteristics at several GHz or more will now be described.

FIG. 5A is a graph illustrating the ground inductance of the through-hole with respect to the thickness of the dielectric substrate; and FIG. 5B is a schematic perspective view of an example of the through-hole.

As illustrated in FIG. 5B, the through-hole has a circular columnar configuration in which the diameter is taken as d, and the height is taken as h. For example, in the case where the diameter d is 0.2 mm, the inductance is 0.25 nH when the dielectric substrate thickness is 0.4 mm. On the other hand, the inductance is small and is 0.04 nH when the dielectric substrate thickness is 0.1 mm.

FIG. 6 is a graph illustrating the ground impedance of the through-hole with respect to the dielectric substrate thickness.

In the case where the diameter d is 0.2 mm and the dielectric substrate thickness is 0.4 mm, the impedance (@ 20 GHz) due to the ground inductance is about 30Ω. On the other hand, in the case where the diameter d is 0.2 mm and the dielectric substrate thickness is 0.1 mm, impedance (@ 20 GHz) due to the ground inductance is reduced to about 5Ω.

Figure 7A:
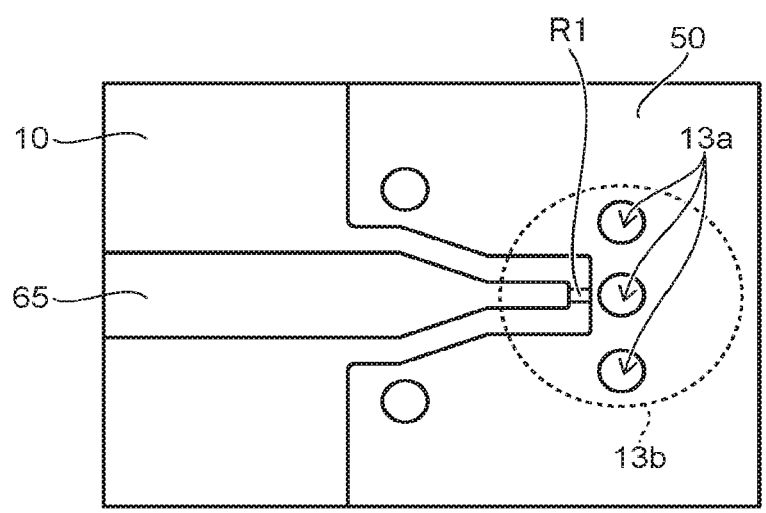
FIG. 7A is a schematic plan view in which a terminating resistance of 50Ω is connected between the ground and the microstripline upper electrode of the high frequency circuit board.
Figure 7B:
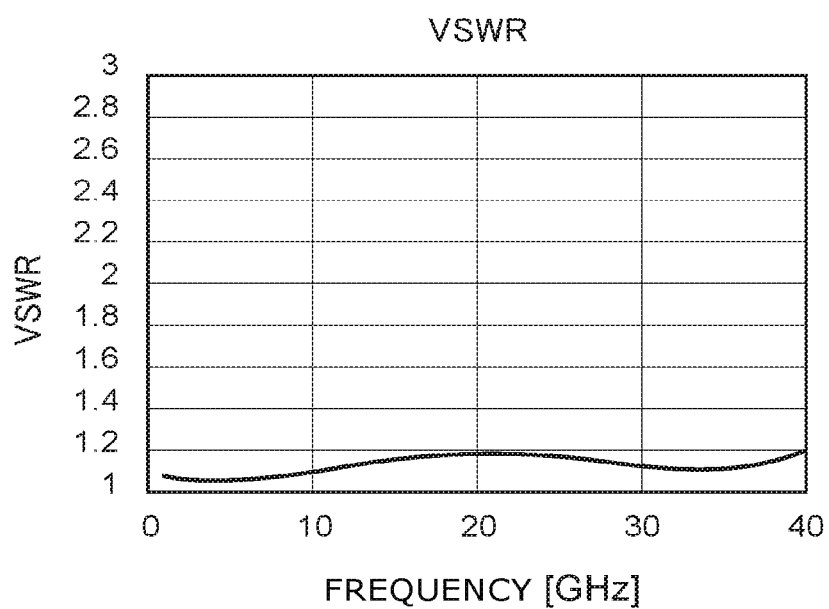
FIG. 7B is a graph illustrating the frequency characteristics of the voltage standing wave ratio from an electromagnetic field simulation.

FIG. 7A is a schematic plan view in which a terminating resistance of 50Ω is connected between the ground and the microstripline upper electrode of the high frequency circuit board; and FIG. 7B is a graph illustrating the frequency characteristics of the voltage standing wave ratio from an electromagnetic field simulation.

As illustrated in FIG. 7A, a terminating resistance R1 is provided between the microstripline upper electrode 65 and the upper ground electrode 50. In FIG. 7B, the vertical axis is the VSWR (Voltage Standing Wave Ratio) determined by the electromagnetic field simulation; and the horizontal axis is the frequency. In the first embodiment, degradation of the high frequency characteristics due to the discontinuity of the line impedance and/or the unnecessary inductance of the ground through-hole is suppressed. As a result, up to 40 GHz, the VSWR is suppressed to about 1.2 or less. Multiple first openings 13a are provided as necessary to suppress the high frequency resonance.

Figure 8A:
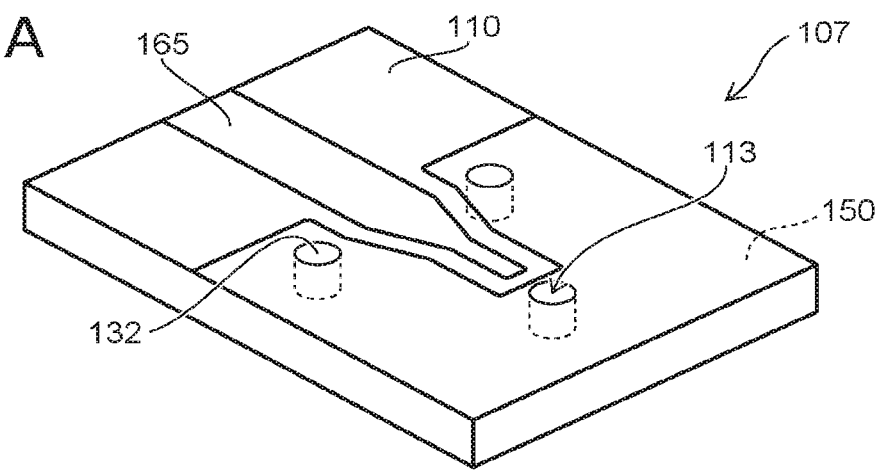
FIG. 8A is a schematic perspective view of a grounding structure of a high frequency circuit board according to a first comparative example.
Figure 8B:
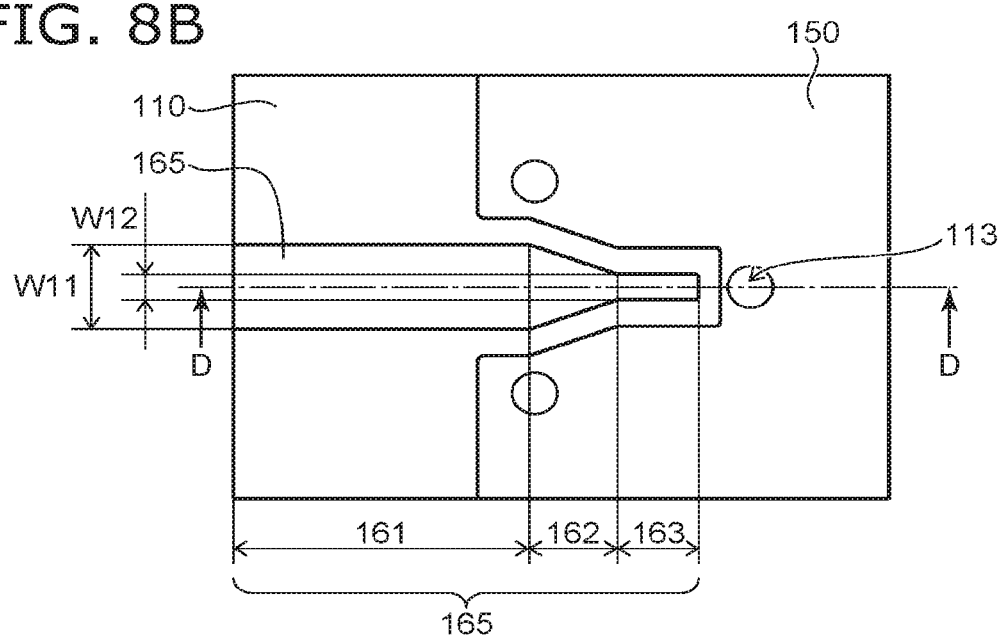
FIG. 8B is a schematic plan view of the grounding structure.
Figure 8C:
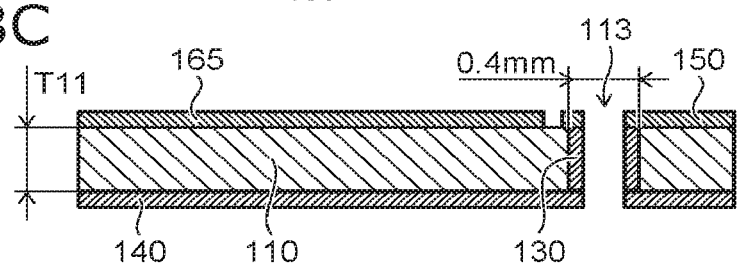
FIG. 8C is a schematic cross-sectional view along line D-D.

FIG. 8A is a schematic perspective view of a grounding structure of a high frequency circuit board according to a first comparative example; FIG. 8B is a schematic plan view of the grounding structure; and FIG. 8C is a schematic cross-sectional view along line D-D.

The grounding structure of the high frequency circuit board 107 includes a dielectric substrate 110, a first grounding conductor layer 130, a back surface ground electrode 140, an upper ground electrode 150, and a microstripline upper electrode 165. A first through-hole 113 is provided in the dielectric substrate 110.

For example, a thickness T11 of the dielectric substrate 110 can be set to 0.4 mm, etc. The back surface ground electrode 140 is connected with the first grounding conductor layer 130. Also, the upper ground electrode 150 is connected with the first grounding conductor layer 130 and further connected to the back surface ground electrode 140. In the first comparative example, the length of the grounding conductor layer 130 in the first through-hole 113 is the same as the thickness T11 of the dielectric substrate 110. Therefore, the ground inductance is large.

The microstripline upper electrode 165 includes a first region 161 and a second region 163. One end portion of the second region 163 is provided to oppose the first through-hole 113. A line width W12 of the second region 163 is narrower than a line width W11 of the first region 161.

Figure 9:
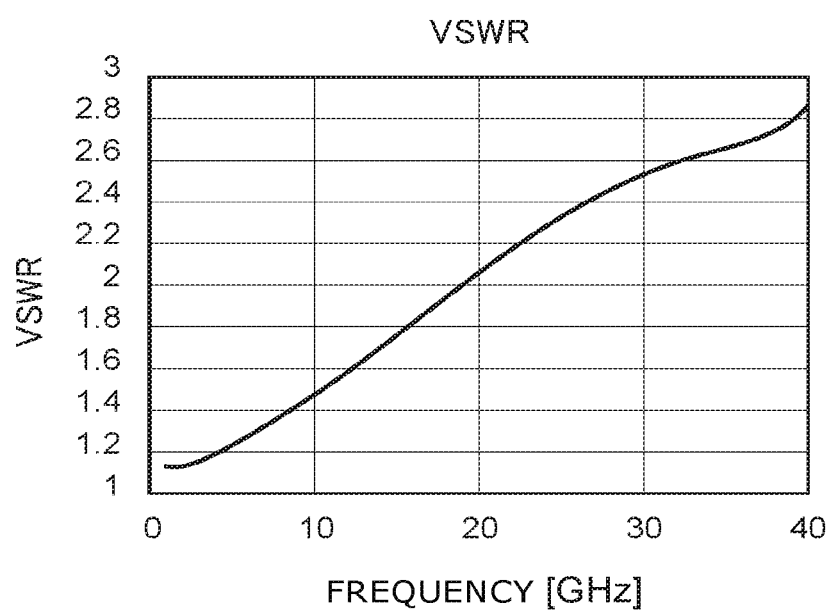
FIG. 9 is a graph illustrating results of an electromagnetic field simulation when a terminal of 50Ω is connected to the high frequency circuit board of the first comparative example.

FIG. 9 is a graph illustrating results of an electromagnetic field simulation when a terminal of 50Ω is connected to the high frequency circuit board of the first comparative example.

The vertical axis is the VSWR; and the horizontal axis is the frequency. The VSWR starts to degrade at several GHz or more due to the discontinuity of the line impedance of the second region 163 having the line width which becomes narrow and/or because the unnecessary inductance of the ground through-hole (height being 0.4 mm) is large. For example, the VSWR is about 2.8 at 40 GHz; and the high frequency characteristics degrade.

Figure 10A:
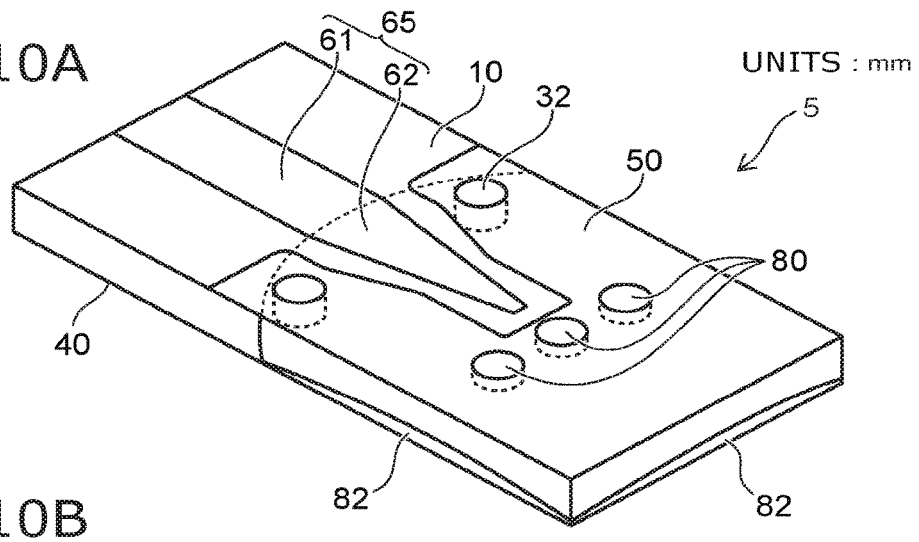
FIG. 10A is a schematic perspective view of a grounding structure of a high frequency circuit board according to a second embodiment.
Figure 10B:
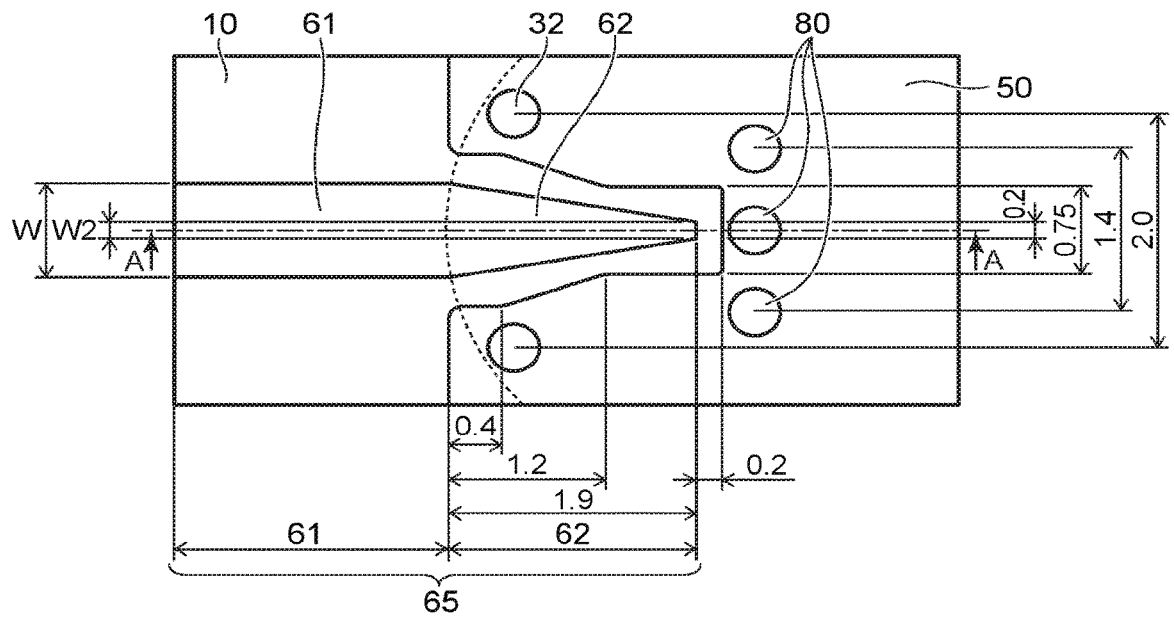
FIG. 10B is a schematic plan view of the grounding structure.
Figure 10C:
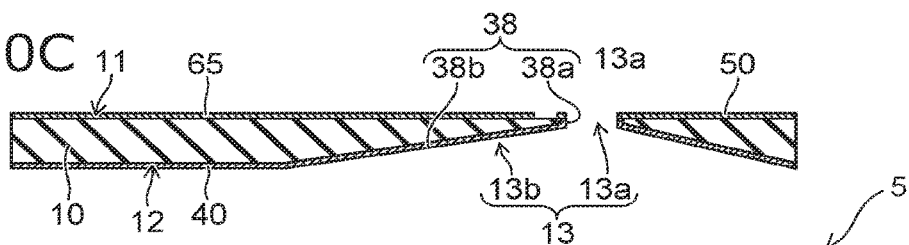
FIG. 10C is a schematic cross-sectional view of the dielectric substrate along line A-A.
Figure 10D:
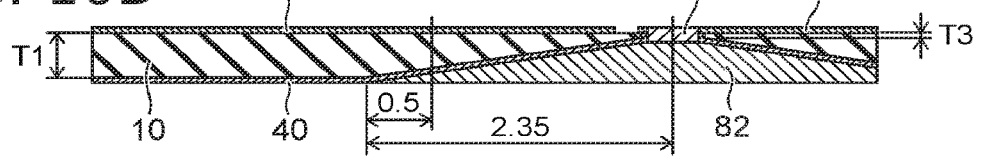
FIG. 10D is a schematic cross-sectional view in which first and second conductor layers are filled into the first through-hole.

FIG. 10A is a schematic perspective view of a grounding structure of a high frequency circuit board according to a second embodiment; FIG. 10B is a schematic plan view of the grounding structure; FIG. 10C is a schematic cross-sectional view of the dielectric substrate along line A-A; and FIG. 10D is a schematic cross-sectional view in which first and second conductor layers are filled into the first through-hole.

In the grounding structure according to the second embodiment, the first through-hole 13 includes a sidewall widening toward the second surface 12 from the boundary between the first opening 13a and the second opening 13b. Therefore, the thickness of the dielectric substrate 10 thins from the end portion of the second opening 13b (the thickness T1) toward the first opening 13a. Also, the line width of the taper region 62 of the microstripline upper electrode 65 becomes narrow toward the first opening 13a of the first through-hole 13. The characteristic impedance of the microstripline is dependent on the ratio of the line width and the dielectric substrate thickness. Therefore, the inductance of a first grounding conductor layer 38 can be reduced while maintaining the ratio of the line width and the dielectric substrate thickness at a prescribed value toward the first opening 13a of the first through-hole 13 and while maintaining the impedance value at a prescribed value (e.g., 50Ω) by reducing these together.

For example, the thickness T1 of the dielectric substrate 10 is set to 0.4 mm, etc. Also, for example, the depth T3 of the first opening 13a can be set to 0.1 mm, etc. Also, for example, the line width W1 of the first region 61 of the microstripline 65 is set to 0.8 mm; and, for example, the line width W2 of the one end portion of the microstripline 65 is set to 0.2 mm, etc.

In the case where the high frequency device 90 is an amplifier or an RF switch, the thermal resistance is reduced by filling a first conductor layer 80 inward of a first grounding conductor layer 38a provided at the sidewall of the first opening 13a because the first conductor layer 80 becomes a heat dissipation path. Further, by filling a second conductor layer 82 inward of a first grounding conductor layer 38b provided at the sidewall of the second opening 13b, the heat dissipation path widens further in a radial configuration downward; therefore, the generated heat is dissipated easily externally via a heat dissipation plate, etc. For example, if the second conductor layer 82 is a solder material, it is easy to closely adhere to the heat dissipation plate, etc.

Figure 11:
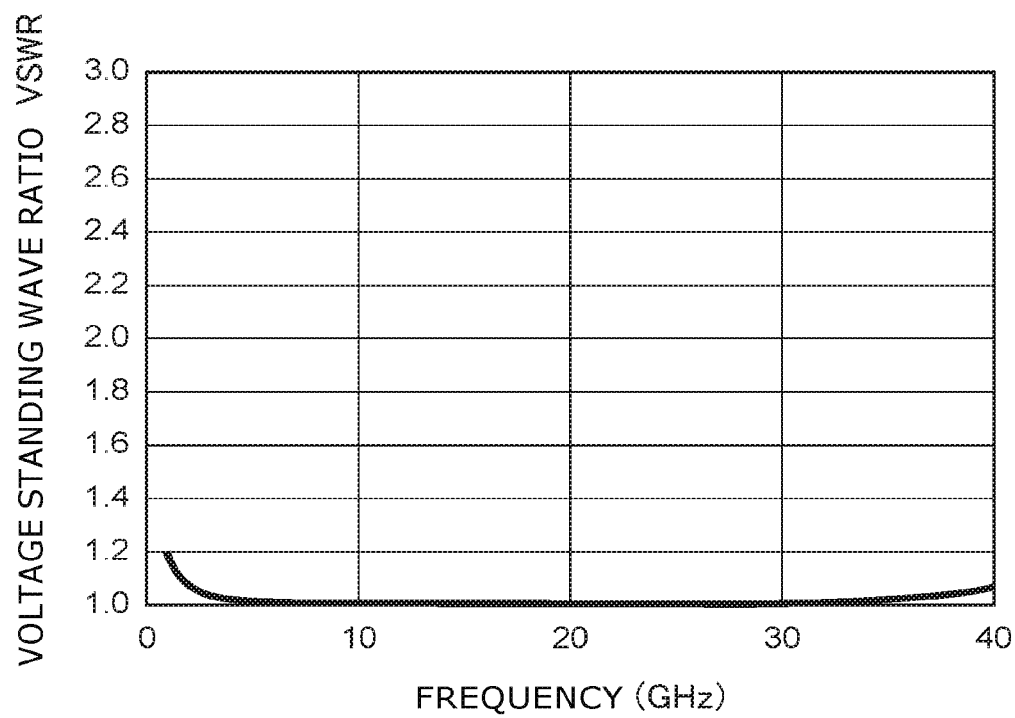
FIG. 11 is a graph illustrating the frequency characteristics of the voltage standing wave ratio from an electromagnetic field simulation when a terminal of 50Ω is connected to the high frequency substrate of the second embodiment.

FIG. 11 is a graph illustrating the frequency characteristics of the voltage standing wave ratio from an electromagnetic field simulation when a terminal of 50Ω is connected to the high frequency substrate of the second embodiment.

The voltage standing wave ratio is 1.03 or less in the bandwidth of 3 to 40 GHz, and is reduced compared to that of the first embodiment of FIG. 7B which is 1.2 or less at 3 to 40 GHz. In other words, the high frequency characteristics are improved because the ground inductance is reduced while setting the ratio of the thickness of the dielectric substrate to the microstripline width to the prescribed value.

Figure 12A:
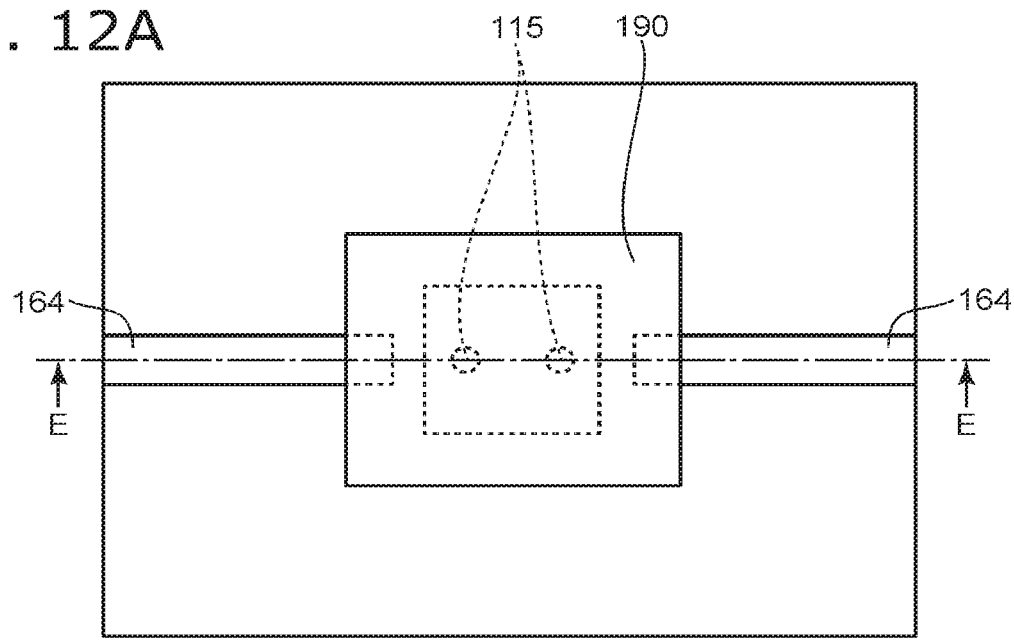
FIG. 12A is a schematic plan view of a grounding structure of a high frequency circuit board according to a second comparative example.
Figure 12B:
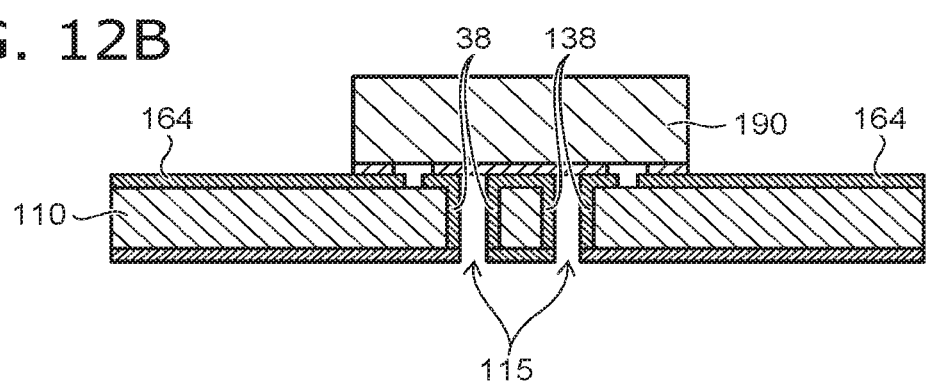
FIG. 12B is a schematic cross-sectional view along line E-E.

FIG. 12A is a schematic plan view of a grounding structure of a high frequency circuit board according to a second comparative example; and FIG. 12B is a schematic cross-sectional view along line E-E.

According to the first and second embodiments, a grounding structure of a high frequency circuit board is provided in which the ground inductance is reduced, and the high frequency characteristics are improved in a high frequency band of several GHz or more. Therefore, the embodiments are widely applicable to microwave to millimeter-wave communication devices.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

The invention claimed is:

1. A grounding structure of a high frequency circuit board, comprising:
   a dielectric substrate having a first surface, a second surface, and a first through-hole, the second surface being provided at a side opposite to the first surface, a first opening of the first through-hole at the first surface being smaller than a second opening of the first through-hole at the second surface;
   a first grounding conductor layer provided in the first through-hole;
   a back surface ground electrode provided at the second surface and connected with the first grounding conductor layer;
   an upper ground electrode provided at the first surface and connected with at least the first grounding conductor layer; and a microstripline upper electrode provided at the first surface, the microstripline upper electrode including at least a first region having a first line width, the microstripline upper electrode having one end portion provided to oppose the first opening and overlap the second opening, a second line width of the one end portion being narrower than the first line width.

2. The grounding structure of the high frequency circuit board according to claim 1, wherein the first grounding conductor layer covers a sidewall of the first through-hole.

3. The grounding structure of the high frequency circuit board according to claim 1, wherein
the microstripline upper electrode includes a taper region between the first region and the one end portion, and
between an end portion of the second opening and the first opening, a ratio of a line width of the taper region and a thickness of the dielectric substrate is set to a prescribed value.

4. The grounding structure of the high frequency circuit board according to claim 2, wherein a first conductor layer is filled inward of the first grounding conductor layer of the sidewall of the first through-hole.

5. The grounding structure of the high frequency circuit board according to claim 4, wherein a second conductor layer is filled into the second opening of the first through-hole.

6. The grounding structure of the high frequency circuit board according to claim 5, wherein the second conductor layer includes a solder material.

* * * * *